United States Patent
Hwang

(10) Patent No.: US 8,609,491 B2
(45) Date of Patent: Dec. 17, 2013

(54) METHOD FOR FABRICATING SEMICONDUCTOR DEVICE WITH BURIED BIT LINES

(75) Inventor: Eui-Seong Hwang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 210 days.

(21) Appl. No.: 13/153,958

(22) Filed: Jun. 6, 2011

(65) Prior Publication Data

US 2012/0171846 A1    Jul. 5, 2012

(30) Foreign Application Priority Data

Dec. 30, 2010  (KR) .......................... 10-2010-0139486

(51) Int. Cl.
*H01L 21/336*    (2006.01)

(52) U.S. Cl.
USPC ........... 438/268; 438/156; 438/262; 438/424; 438/427; 438/435; 438/666; 438/674; 438/696; 438/700; 438/702; 438/703; 438/704; 438/735; 438/736; 438/761

(58) Field of Classification Search
USPC ......... 438/156, 262, 268, 424, 427, 435, 666, 438/674, 696, 700, 702–704, 735–736, 761
See application file for complete search history.

(56) References Cited

U.S. PATENT DOCUMENTS

| | | | | |
|---|---|---|---|---|
| 6,800,898 B2 * | 10/2004 | Cappelani et al. | ............ | 257/329 |
| 8,350,323 B2 * | 1/2013 | Mikasa | ........................ | 257/330 |
| 2009/0173985 A1 * | 7/2009 | Lee et al. | ...................... | 257/315 |
| 2011/0073940 A1 * | 3/2011 | Lee et al. | ...................... | 257/332 |
| 2011/0101447 A1 * | 5/2011 | Cho | .............................. | 257/329 |
| 2011/0143508 A1 * | 6/2011 | Kim et al. | ..................... | 438/270 |
| 2011/0284942 A1 * | 11/2011 | Dong et al. | ................... | 257/314 |

FOREIGN PATENT DOCUMENTS

| | | |
|---|---|---|
| KR | 1020080002480 | 1/2008 |
| KR | 1020090099774 | 9/2009 |
| KR | 1020100071406 | 6/2010 |

OTHER PUBLICATIONS

Notice of Allowance issued from the Korean Intellectual Property Office on Jul. 30, 2012.

* cited by examiner

*Primary Examiner* — Bac Au
(74) *Attorney, Agent, or Firm* — IP & T Group LLP

(57) ABSTRACT

A method for fabricating a semiconductor device includes etching a substrate to form trenches that separate active regions, forming an insulation layer having an opening to open a portion of a sidewall of each active region, forming a silicon layer pattern to gap-fill a portion of each trench and cover the opening in the insulation layer, forming a metal layer over the silicon layer pattern, and forming a metal silicide layer as buried bit lines, where the metal silicide layer is formed when the metal layer reacts with the silicon layer pattern.

24 Claims, 16 Drawing Sheets

METHOD FOR FABRICATING SEMICONDUCTOR DEVICE WITH BURIED BIT LINES

CROSS-REFERENCE TO RELATED APPLICATIONS

The present application claims priority of Korean Patent Application No. 10-2010-0139486, filed on Dec. 30, 2010, which is incorporated herein by reference in its entirety.

BACKGROUND OF THE INVENTION

Exemplary embodiments of the present invention relate to a method for fabricating a semiconductor device, and more particularly, to a method for fabricating a semiconductor device with buried bit lines.

As the degree of integration for Dynamic Random Access Memory (DRAM) devices increases, two-dimensional (2D) structures are reaching limits. Thus, three-dimensional (3D) DRAMs with vertical gates (VG), which are referred to hereinafter as VG DRAM, are being developed.

A 3D DRAM having a vertical gate structure may include active regions, each of which is formed of a body and a pillar formed over the body, buried bit lines BBL, and vertical gates VG. The bodies of adjacent active regions are separated from each other by a trench and the buried bit lines BBL are formed within the trenches. Each buried bit line BBL is electrically connected with a sidewall of each active region. Each vertical gate VG is formed on one sidewall of a pillar over a buried bit line BBL, and a source and a drain are formed within the pillar. The vertical gate VG is used for formation of a vertical channel between the source and the drain.

In order to drive a cell in a buried bit line BBL, a One-Side-Contact (OSC) process may be used. The one-side contact process may be also referred to as a Single-Side-Contact (SSC). The one-side contact process is a process for forming a contact in an active region while insulating the active region from adjacent active regions.

Since bit lines have a buried structure in the three-dimensional DRAM having a vertical gate structure, the area of the buried bit lines BBL is limited. Therefore, a metal layer may be used to form the buried bit lines BBL with a low bit line resistance. In order to fill a metal layer in deep trenches without void, a Chemical Vapor Deposition (CVD) process or an Atomic Layer Deposition (ALD) process may be used.

Buried bit lines BBL may be formed of a titanium nitride (TiN) layer and a tungsten (W) layer. The titanium nitride (TiN) layer and the tungsten (W) layer are deposited through the CVD process.

Here, when the line width of the buried bit lines BBL is decreased, drastic resistance increase may occur because the area occupied by tungsten (W) in the buried bit lines BBL is decreased while the thickness of the titanium nitride (TiN) layer remains the same.

Since the CVD process results in rough surfaces of the tungsten layer, void and seam may be created.

When a subsequent etch-back process is performed to acquire a desired bit line height, the buried bit lines BBL may be cut undesirably or punctured all the way through to the lower substrate and thus defective semiconductor device products may result.

SUMMARY OF THE INVENTION

An exemplary embodiment of the present invention is directed to a semiconductor device fabrication method that may decrease the resistance of buried bit lines.

In accordance with an exemplary embodiment of the present invention, a method for fabricating a semiconductor device includes: etching a substrate to form trenches that separate active regions; forming an insulation layer having an opening to open a portion of a sidewall of each active region; forming a silicon layer pattern to gap-fill a portion of each trench and cover the opening in the insulation layer; forming a metal layer over the silicon layer pattern; and forming a metal silicide layer as buried bit lines, where the metal silicide layer is formed when the metal layer reacts with the silicon layer pattern.

In accordance with another exemplary embodiment of the present invention, a method for fabricating a semiconductor device includes: etching a substrate to form trenches that separate active regions; forming an insulation layer having an opening to open a portion of a sidewall of each active region; forming a silicon layer over the insulation layer to gap-fill a portion of each trench; forming spacers on portions of sidewalls of the insulation layer; etching the silicon layer by using the spacers as an etch barrier; forming a metal layer over the etched silicon layer; and forming a metal silicide layer as buried bit lines, where the metal silicide layer is formed when the metal layer reacts with the silicon layer.

DESCRIPTION OF SPECIFIC EMBODIMENTS

Figure 1A:
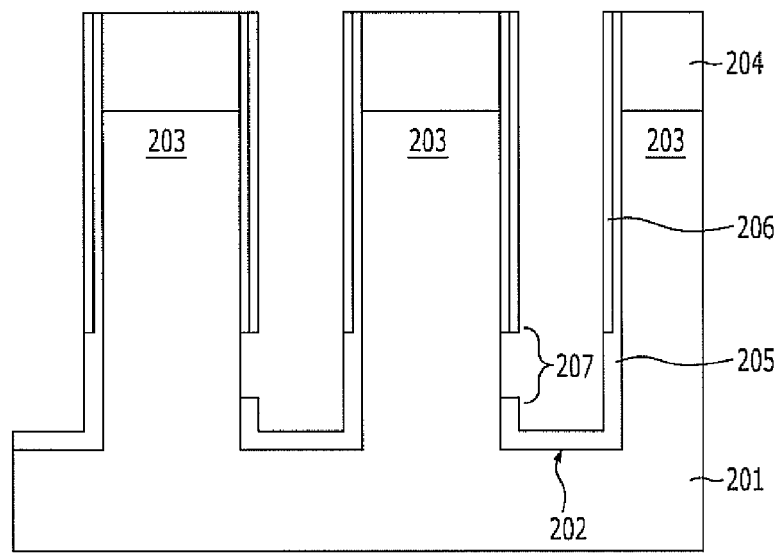
FIGS. 1A to 1F are cross-sectional views illustrating a method for fabricating a semiconductor device in accordance with a first exemplary embodiment of the present invention.

Exemplary embodiments of the present invention will be described below in more detail with reference to the accompanying drawings. The present invention may, however, be embodied in different forms and should not be construed as limited to the embodiments set forth herein.

Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 1A to 1F are cross-sectional views illustrating a method for fabricating a semiconductor device in accordance with a first embodiment of the present invention.

Referring to FIG. 1A, a plurality of bodies 203 which are separated from each other by a plurality of trenches 202 are formed over a substrate 201. The substrate 201 may be a silicon substrate. The trenches 202 are formed by etching the substrate 201 for a desired depth, where the bodies 203 are formed while creating the trenches 202. Since the substrate 201 is a silicon substrate, the bodies 203 are silicon bodies. The bodies 203 are extended perpendicularly to the surface of the substrate 201. The bodies 203 are used as active regions which are areas for forming channels, sources and drains of transistors. Each body 203 has a plurality of sidewalls, forms a line-type body including at least two opposing sidewalls, and may be also referred to as an active body.

A hard mask layer 204 is formed over the bodies 203. The hard mask layer 204 functions as an etch barrier when the substrate 201 is etched to form the trenches 202. The hard mask layer 204 includes a dielectric material such as oxide and nitride. According to an example, a nitride layer is used as the hard mask layer 204, where the hard mask layer 204 is a silicon nitride layer.

An insulation layer 205 and 206 is formed on both sidewalls of each body 203, the remaining surfaces of the trenches 202 between the bodies 203, and the sidewalls of the hard mask layer 204. The insulation layer includes a liner oxide layer 205 and a liner nitride layer 206. The liner oxide layer 205 is formed on both sidewalls of each body 203 and the horizontal surfaces of the substrate 201 at the bottom of trenches 202. The liner nitride layer 206 is formed on the surface of a portion (for example, an upper portion) of the liner oxide layer 205.

An opening 207 is formed by removing a portion of the insulation layer. The opening 207 forms a One-Side-Contact (OSC) structure which selectively exposes a portion of one sidewall of each body 203 and forms a line-type contact in that the opening 207 opens a portion of one sidewall of each body 203 in a line shape along the direction that the body 203 is extended.

As described above, the insulation layer 205 and 206 provides the opening 207 that exposes a portion of one sidewall of each body 203.

Although not illustrated in the drawings, after the opening 207 is formed, a junction may be formed on a portion of one sidewall of each body 203 by using a tilt ion implantation process, a plasma doping process, or a thermal diffusion process using a doped layer. According to an example, the junction has a doping concentration of approximately $1\times10^{20}$ atoms/cm$^3$ or higher where the dopant is be phosphorus (P) or arsenic (As) so that the junction becomes an N-type junction. By using the plasma doping process or the thermal diffusion process in forming the junction, the depth of the junction may be controlled to be shallow and the doping concentration of dopant may be easily controlled, where the junction becomes a source or drain of a vertical channel transistor.

Figure 1B:
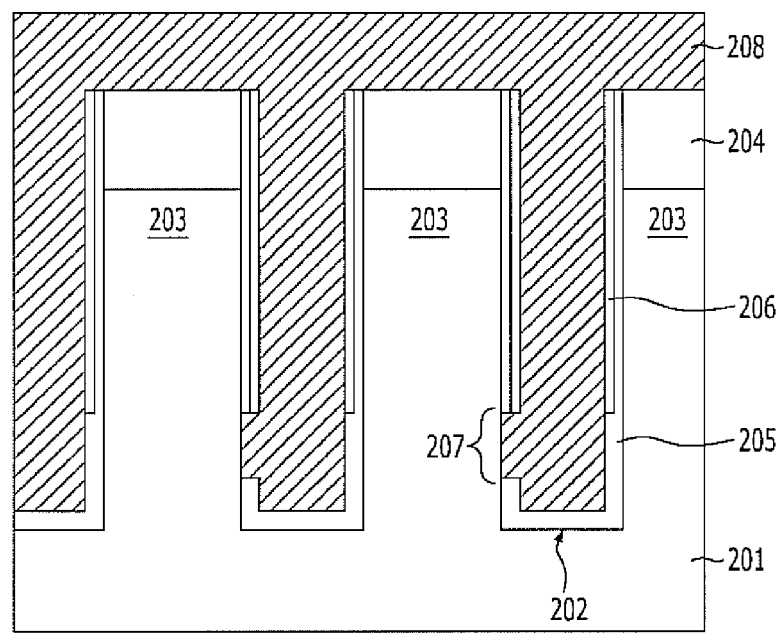

Referring to FIG. 1B, a polysilicon layer 208 is formed to gap-fill the trenches 202. The polysilicon layer 208 is formed through an Atomic Layer Deposition (ALD) process or a Chemical Vapor Deposition (CVD) process. In this way, the trenches 202 may be gap-filled without void.

Figure 1C:
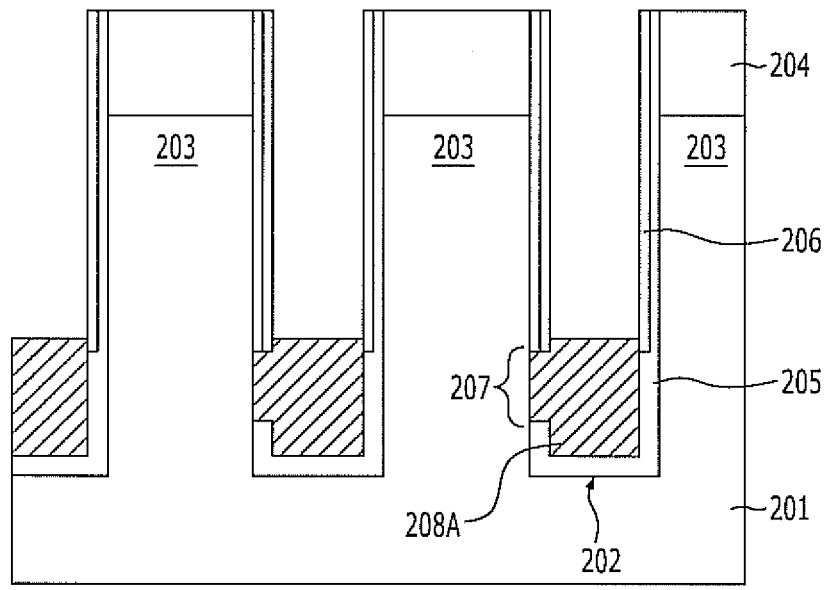

Referring to FIG. 1C, the trenches 202 are partially filled with the polysilicon layer 208 after selectively removing the polysilicon layer 208. Accordingly, a polysilicon layer pattern 208A is formed in the trenches 202. The polysilicon layer pattern 208A partially fills the trenches 202 and covers the opening 207. Also, the polysilicon layer pattern 208A is formed to have a sufficient height to completely cover the opening 207.

To form the polysilicon layer pattern 208A, an etch-back process is performed or the etch-back may be performed after a planarization process is performed using a Chemical Mechanical Polishing (CMP).

Figure 1D:
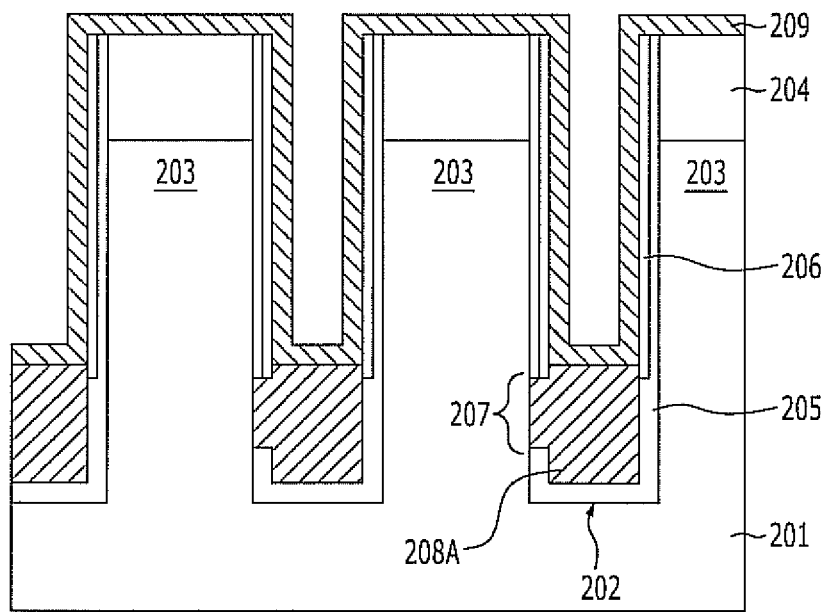

Referring to FIG. 1D, a metal layer 209 is formed. The metal layer 209 includes metals that may induce a silicidation reaction. For example, the metal layer 209 includes any one selected from the group consisting of cobalt (Co), titanium (Ti), tantalum (Ta), nickel (Ni), tungsten (W), platinum (Pt), and palladium (Pd). According to an example, a cobalt layer is used as the metal layer 209.

The metal layer 209 is formed through a CVD process or an ALD process. The process temperature, pressure and flow rate of the metal layer 209 are variable according to a precursor used, where the deposition thickness of the metal layer 209 ranges from approximately 50 Å to approximately 500 Å.

Figure 1E:
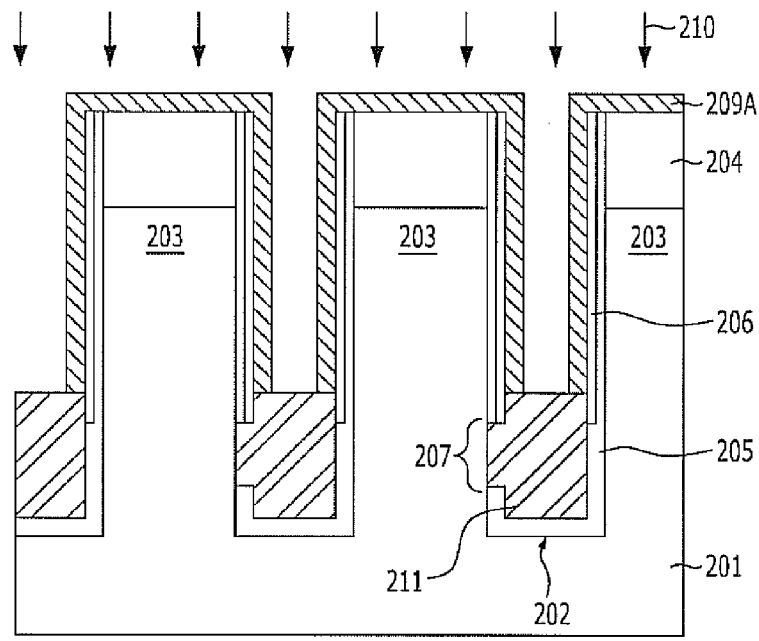

Referring to FIG. 1E, an annealing process 210 is performed. As a result, a metal silicide layer 211 is formed as the polysilicon layer pattern 208A reacts with the metal layer 209. The metal silicide layer 211 includes any one selected from the group consisting of cobalt silicide, titanium silicide, tantalum silicide, nickel silicide, tungsten silicide, platinum silicide, and palladium silicide. The annealing process 210 may be a rapid thermal annealing.

After the formation of the metal silicide layer 211, unreacted metal layer 209A remains.

Figure 1F:
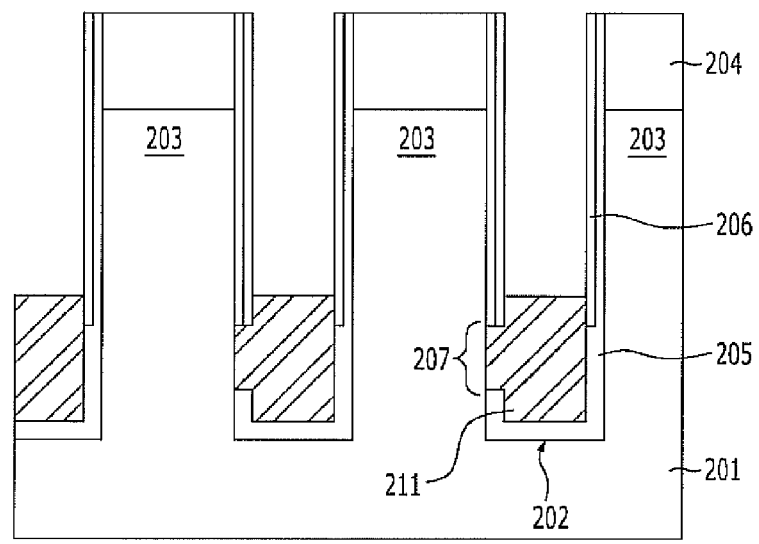

Referring to FIG. 1F, the unreacted metal layer 209A is removed. The unreacted metal layer 209A is removed through a wet-etch process.

According to an example, when the metal layer (209 in FIG. 1D) is a cobalt layer, the annealing process may be performed at least twice to form a cobalt silicide layer. Here, a primary annealing process and a secondary annealing process are performed. The primary annealing process is performed at a temperature ranging from approximately 400° C. to approximately 600° C., and the secondary annealing process is performed at a temperature ranging from approximately 600° C. to approximately 800° C. As a result of the primary annealing process, a cobalt silicide having a phase of CoSi$_x$ where x ranges from 0.1 to 1.5 is formed. As a result of the secondary annealing process, the cobalt silicide having a phase of CoSi$_x$ where x ranges from 0.1 to 1.5 is transformed into a cobalt silicide of a CoSi$_2$ phase. Among the cobalt silicides, the cobalt silicide of the CoSi$_2$ phase has the lowest resistivity. Unreacted cobalt layer (for example, 209A in FIG. 1E) is removed between the primary annealing process and the secondary annealing process by using a chemical mixture of sulfuric acid (H$_2$SO$_4$) and hydrogen peroxide (H$_2$O$_2$).

The metal silicide layer 211 in the first exemplary embodiment of the present invention forms a buried bit line BBL coupled with the body 203 through the opening 207. The resistance of buried bit lines BBL may be reduced by using the metal silicide layer 211 as the buried bit lines. Junction leakage is decreased because silicidation reaction is prevented in the bodies 203 by using the polysilicon layer pattern 208A as buffer.

By reducing the resistance of the buried bit lines, an operation speed of a semiconductor device may be increased.

FIGS. 2A to 2F are cross-sectional views illustrating a method for fabricating a semiconductor device in accordance with a second exemplary embodiment of the present invention.

Figure 2A:
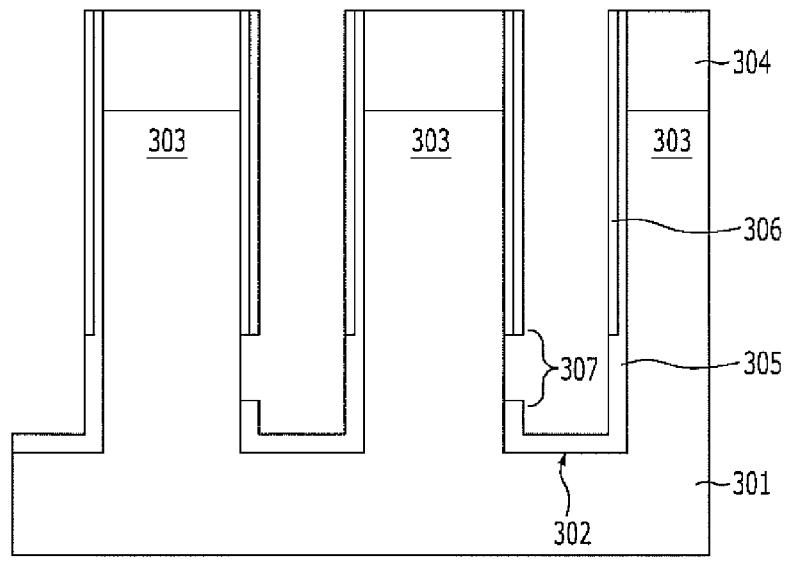
FIGS. 2A to 2F are cross-sectional views illustrating a method for fabricating a semiconductor device in accordance with a second exemplary embodiment of the present invention.

Referring to FIG. 2A, a plurality of bodies 303 which are separated from each other by a plurality of trenches 302 are formed over a substrate 301. The substrate 301 includes a silicon substrate. The trenches 302 are formed by etching the substrate 301 for a desired depth, where the bodies 303 are formed in creating the trenches 302. Since the substrate 301 is a silicon substrate, the bodies 303 are silicon bodies. The bodies 303 are extended perpendicularly to the surface of the substrate 301. The bodies 303 are used as active regions which are areas for forming channels, sources and drains of transistors. Each body 303 has a plurality of sidewalls, forms a line-type body including at least two opposing sidewalls, and may be referred to as an active body.

A hard mask layer 304 is formed over the bodies 303. The hard mask layer 304 functions as an etch barrier when the substrate 301 is etched to form the trenches 302. The hard mask layer 304 includes a dielectric material such as oxide and nitride. According to an example, a nitride layer is used as the hard mask layer 304, where the hard mask layer 304 is a silicon nitride layer.

An insulation layer 305 and 306 is formed on both sidewalls of each body 303, the remaining surfaces of the trenches 302 between the bodies 303, and the sidewalls of the hard mask layer 304. The insulation layer includes a liner oxide layer 305 and a liner nitride layer 306. The liner oxide layer 305 is formed on both sidewalls of each body 303 and the horizontal surfaces of the substrate 301 at the bottom of trenches 302. The liner nitride layer 306 is formed on the surface of a portion (for example, an upper portion) of the liner oxide layer 305.

An opening 307 is formed by removing a portion of the insulation layer. The opening 307 forms a One-Side-Contact (OSC) structure which selectively exposes a portion of a sidewall of each body 303 and forms a line-type contact in that the opening 307 opens a portion of one sidewall of each body 303 in a line shape along the direction that the body 303 is extended.

As described above, the insulation layer 305 and 306 provides the opening 307 that exposes a portion of one sidewall of each body 303.

Although not illustrated in the drawings, after the opening 307 is formed, a junction may be formed on a portion of one sidewall of each body 303 by using a tilt ion implantation process, a plasma doping process, or a thermal diffusion process using a doped layer. According to an example, the junction has a doping concentration of approximately $1 \times 10^{20}$ atoms/cm$^3$ or higher where the dopant may be a phosphorus (P) or arsenic (As) so that the junction becomes an N-type junction. By using the plasma doping process or the thermal diffusion process in forming the junction, the depth of the junction may be controlled to be shallow and the doping concentration of dopant may be easily controlled, where the junction becomes a source or drain of a vertical channel transistor.

Figure 2B:
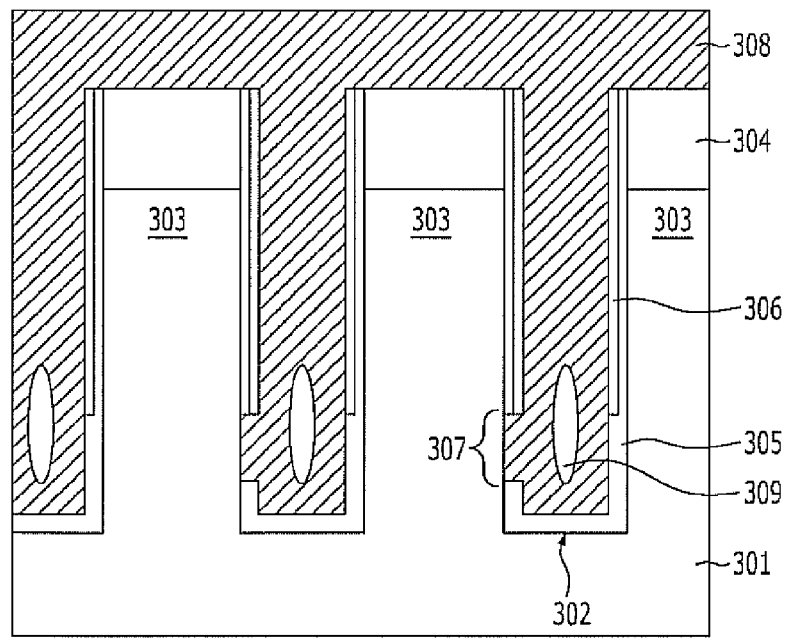

Referring to FIG. 2B, a polysilicon layer 308 is formed to gap-fill the trenches 302. The polysilicon layer 308 is formed through an Atomic Layer Deposition (ALD) process or a Chemical Vapor Deposition (CVD) process. The polysilicon layer 308 is formed in such a manner that seam S (309) is generated. To generate the seam 309 (for example, a cavity/void), the polysilicon layer 308 is controlled to be deposited not in an amorphous phase but in a polycrystalline phase, where the polysilicon layer 308 has a poor step coverage in being deposited. For example, when the polysilicon layer 308 is deposited at a temperature ranging from approximately 600° C. to approximately 900° C., the generation of seams may be induced.

Figure 2C:
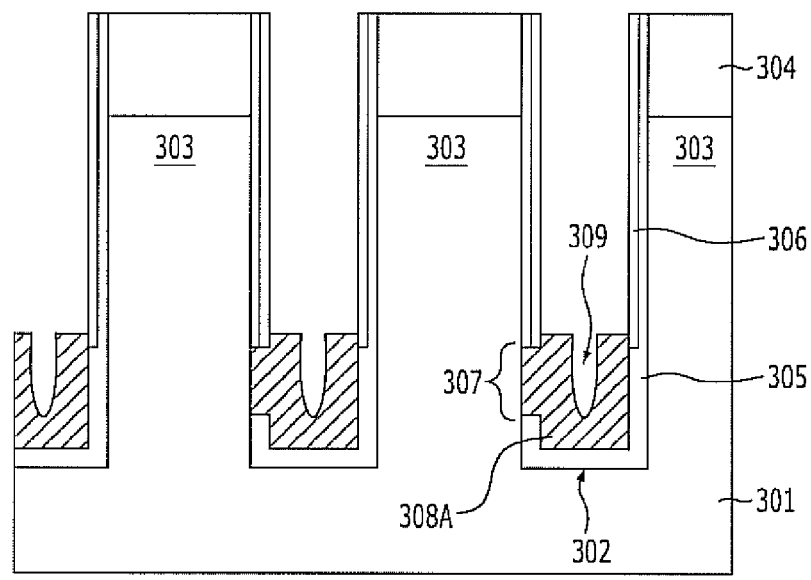

Referring to FIG. 2C, the trenches 302 are partially filled with the polysilicon layer 308 after selectively removing the polysilicon layer 308. Accordingly, a polysilicon layer pattern 308A is formed in the trenches 302. The polysilicon layer pattern 308A partially fills the trenches 302 and covers the opening 307. Also, the polysilicon layer pattern 308A is formed to have a sufficient height to completely cover the opening 307.

To form the polysilicon layer pattern 308A, an etch-back process is performed or the etch-back may be performed after a planarization process is performed using a Chemical Mechanical Polishing (CMP).

Since the seam 309 is generated in the polysilicon layer 308, the seam 309 is exposed at, for example, a lower portion of the seam 309 when the etch-back process is performed. Therefore, the polysilicon layer pattern 308A has a U shaped surface/cavity to thus increase the surface area of the polysilicon layer pattern 308A in comparison to a flat surface configuration.

When the generation of the seam 309 is induced and the subsequent etch-back process is performed to, for example, etch an upper portion of the seam 309, silicide may be prevented from being formed on the bodies 303 during a subsequent silicidation process by using the polysilicon layer pattern 308A as a buffer.

Figure 2D:
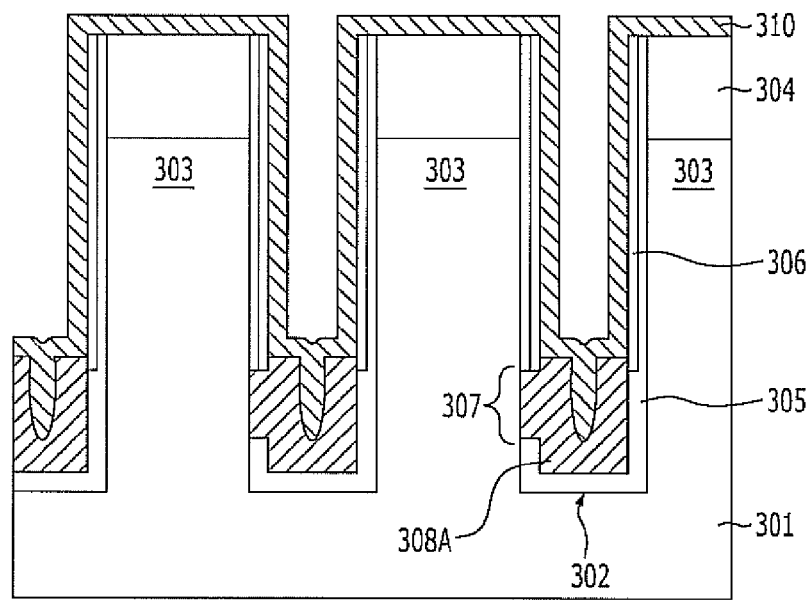

Referring to FIG. 2D, a metal layer 310 is formed. The metal layer 310 includes metals that may induce a silicidation reaction. For example, the metal layer 310 includes any one selected from the group consisting of cobalt (Co), titanium (Ti), tantalum (Ta), nickel (Ni), tungsten (W), platinum (Pt), and palladium (Pd). According to an example, a cobalt layer is used as the metal layer 310.

The metal layer 310 is formed through a CVD process or an ALD process. The process temperature, pressure and flow rate of the metal layer 310 are variable according to a precursor used, where the deposition thickness of the metal layer 310 ranges from approximately 10 Å to approximately 300 Å.

Figure 2E:
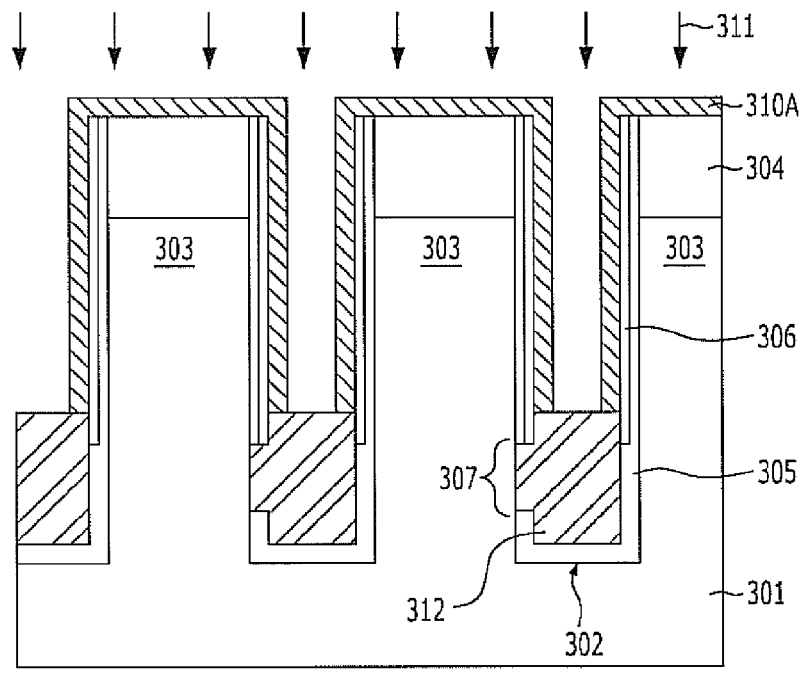

Referring to FIG. 2E, an annealing process 311 is performed. As a result, a metal silicide layer 312 is formed as the polysilicon layer pattern 308A reacts with the metal layer 310. The metal silicide layer 312 includes any one selected from the group consisting of cobalt silicide, titanium silicide, tantalum silicide, nickel silicide, tungsten silicide, platinum silicide, and palladium silicide. The annealing process 311 may be a rapid thermal annealing.

After the formation of the metal silicide layer 312, unreacted metal layer 310A remains.

Figure 2F:
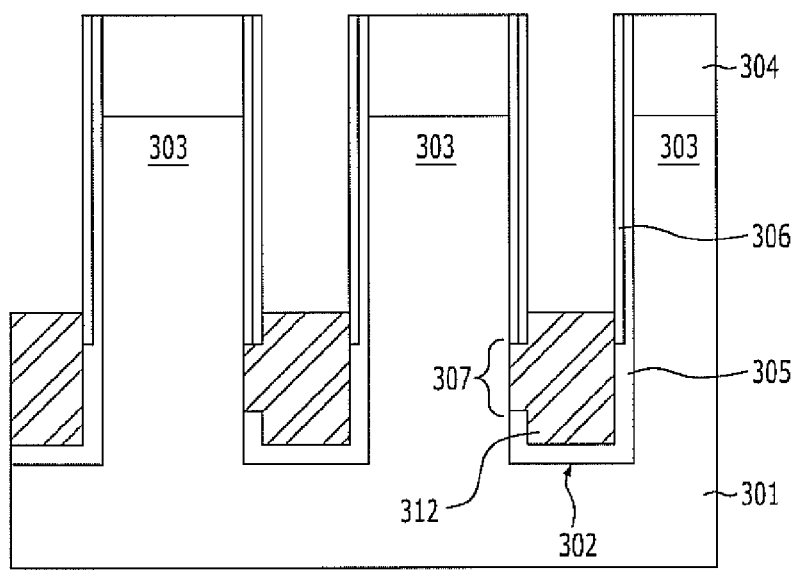

Referring to FIG. 2F, the unreacted metal layer 310A is removed. The unreacted metal layer 310A is removed through a wet-etch process.

According to an example, when the metal layer (310 in FIG. 2D) is a cobalt layer, the annealing process may be performed at least twice to form a cobalt silicide layer. Here, a primary annealing process and a secondary annealing process are performed. The primary annealing process is performed at a temperature ranging from approximately 400° C. to approximately 600° C., and the secondary annealing process is performed at a temperature ranging from approximately 600° C. to approximately 800° C. As a result of the primary annealing process, a cobalt silicide having a phase of $CoSi_x$ where x ranges from 0.1 to 1.5 is formed. As a result of the secondary annealing process, the cobalt silicide having a phase of $CoSi_x$ where x ranges from 0.1 to 1.5 is transformed into a cobalt silicide of a $CoSi_2$ phase. Among the cobalt silicides, the cobalt silicide of the $CoSi_2$ phase has the lowest resistivity. Unreacted cobalt layer (for example, 310A in FIG. 2E) is removed between the primary annealing process and the secondary annealing process by using a chemical mixture of sulfuric acid ($H_2SO_4$) and hydrogen peroxide ($H_2O_2$).

The metal silicide layer 312 in the second exemplary embodiment of the present invention forms a buried bit line BBL coupled with the body 303 through the opening 307. The resistance of buried bit lines BBL may be reduced by using the metal silicide layer 312 as the buried bit lines. Junction leakage is decreased because silicidation reaction is prevented in the bodies 303 by using the polysilicon layer pattern 308A as buffer.

By reducing the resistance of the buried bit lines, an operation speed of a semiconductor device may be increased.

According to the second exemplary embodiment of the present invention, a thinner metal silicide layer 312 may be formed, where interface void does not occur at the bottom or sides of the polysilicon layer 308.

FIGS. 3A to 3H are cross-sectional views illustrating a method for fabricating a semiconductor device in accordance with a third exemplary embodiment of the present invention.

Figure 3A:
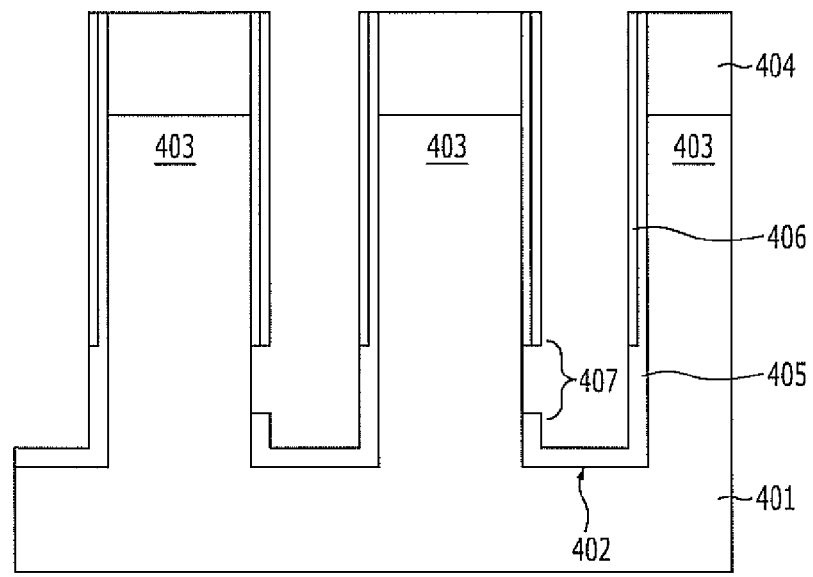
FIGS. 3A to 3H are cross-sectional views illustrating a method for fabricating a semiconductor device in accordance with a third exemplary embodiment of the present invention.

Referring to FIG. 3A, a plurality of bodies 403 which are separated from each other by a plurality of trenches 402 are formed over a substrate 401. The substrate 401 includes a silicon substrate. The trenches 402 are formed by etching the substrate 401 for a desired depth, where the bodies 403 are formed in creating the trenches 402. Since the substrate 401 is a silicon substrate, the bodies 403 are silicon bodies. The bodies 403 are extended perpendicularly to the surface of the substrate 401. The bodies 403 are used as active regions, which are areas for forming channels, sources and drains of transistors. Each body 403 has a plurality of sidewalls, forms a line-type body including at least two opposing sidewalls, and may be referred to as an active body.

A hard mask layer 404 is formed over the bodies 403. The hard mask layer 404 functions as an etch barrier when the substrate 401 is etched to form the trenches 402. The hard mask layer 404 includes a dielectric material such as oxide and nitride. According to an example, a nitride layer is used as the hard mask layer 404, where the hard mask layer 404 is a silicon nitride layer.

An insulation layer 405 and 406 is formed on both sidewalls of each body 403, the remaining surfaces of the trenches 402 between the bodies 403, and the sidewalls of the hard mask layer 404. The insulation layer includes a liner oxide layer 405 and a liner nitride layer 206. The liner oxide layer 405 is formed on both sidewalls of each body 403 and the horizontal surfaces of the substrate 401 at the bottom of the trenches 402. The liner nitride layer 406 is formed on the surface of a portion (for example, an upper portion) of the liner oxide layer 405.

An opening 407 is formed by removing a portion of the insulation layer. The opening 407 forms a One-Side-Contact (OSC) structure which selectively exposes a portion of a sidewall of each body 403 and forms a line-type contact in that the opening 407 opens a portion of one sidewall of each body 403 in a line shape along the direction that the body 403 is extended.

As described above, the insulation layer 405 and 406 provides the opening 407 that exposes a portion of one sidewall of each body 403.

Although not illustrated in the drawings, after the opening 407 is formed, a junction may be formed on a portion of one sidewall of each body 403 by using a tilt ion implantation process, a plasma doping process, or a thermal diffusion process using a doped layer. According to an example, the junction has a doping concentration of approximately $1 \times 10^{20}$ atoms/cm$^3$ or higher where the dopant may be a phosphorus (P) or arsenic (As) so that the junction becomes an N-type junction. By using the plasma doping process or the thermal diffusion process in forming the junction, the depth of the junction may be controlled to be shallow and the doping concentration of a dopant may be easily controlled, where the junction becomes a source or drain of a vertical channel transistor.

Figure 3B:
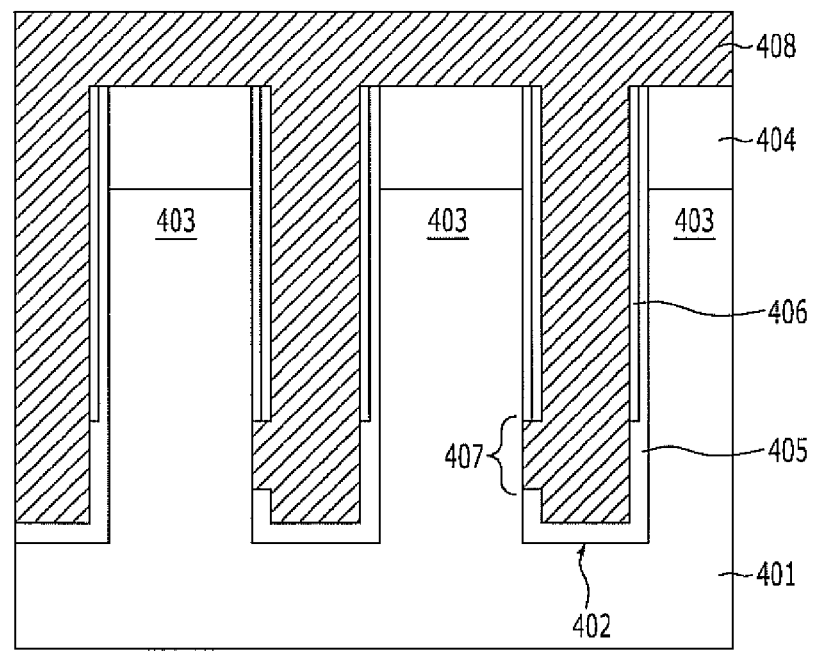

Referring to FIG. 3B, a polysilicon layer 408 is formed to gap-fill the trenches 402. The polysilicon layer 408 is formed through an Atomic Layer Deposition (ALD) process or a Chemical Vapor Deposition (CVD) process. In this way, the trenches 402 may be gap-filled without void.

Figure 3C:
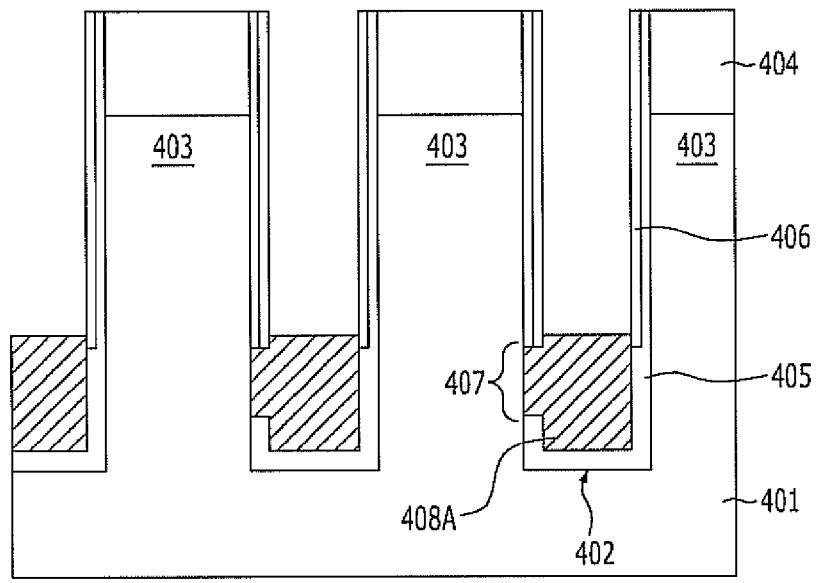

Referring to FIG. 3C, the trenches 402 are partially filled with the polysilicon layer 408 after selectively removing the polysilicon layer 408. Accordingly, a polysilicon layer pattern 408A is formed in the trenches 402. The polysilicon layer pattern 408A partially fills the trenches 402 and covers the opening 207. Also, the polysilicon layer pattern 408A is formed to have a sufficient height to completely cover the opening 207.

To form the polysilicon layer pattern 408A, an etch-back process is performed or the etch-back may be performed after a planarization process is performed using a Chemical Mechanical Polishing (CMP).

Figure 3D:
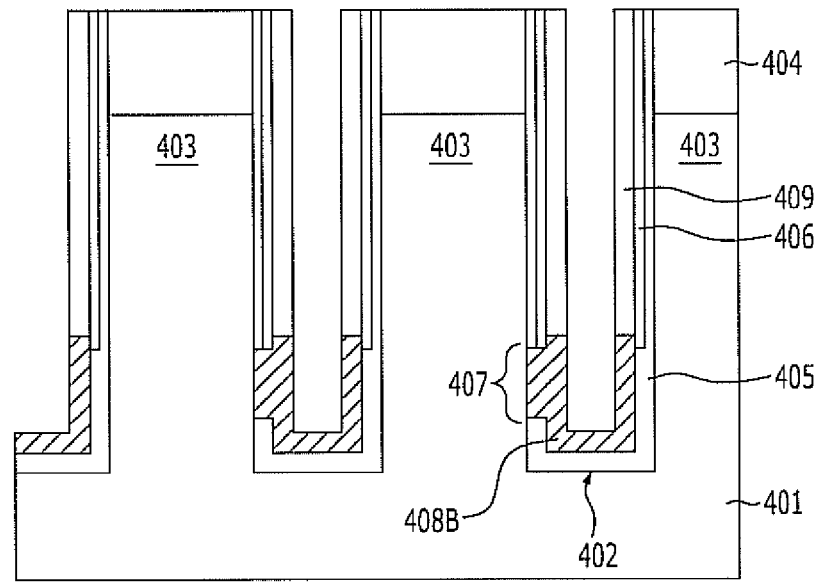

Referring to FIG. 3D, spacers 409 are formed on the sidewalls of the liner nitride layer 406 exposed by the polysilicon layer pattern 408A. The spacers 409 are formed of a material that may be removed after the subsequent formation of a metal silicide layer or a dielectric material, where the spacer material is selected so as not to react with a metal layer in a subsequent thermal process performed at high temperature. The spacers 409 are formed by depositing a spacer layer and performing an etch-back process. The spacers include at least any one selected from the group consisting of a silicon layer, a silicon oxide layer, a silicon nitride layer, TiN, TiAlN, TiW, TiO$_2$, WSi$_2$, WN, TaN, TaW and Ta$_2$O$_5$. When conductive layers are used as the spacers 409, the conductive layers are removed after the subsequent formation of a metal silicide.

Subsequently, the polysilicon layer pattern 408A is partially etched by using the spacers 409 as an etch barrier. As a result, the polysilicon layer pattern comes to have a U shape and a U-shaped cavity. Hereafter, the U-shaped polysilicon layer pattern is denoted with reference numeral '408B'. Thus, the surface area of the polysilicon layer pattern 408B is increased as compared to a flat surface configuration. Here, the U-shaped polysilicon layer pattern 408B remains on the bottom and sidewalls of each trench 402 while still covering the opening 407. According to another example, the polysilicon layer pattern 408B may remain only on the sidewalls of each trench 402 while still covering the opening 407.

As described above, when the polysilicon layer pattern 408B is formed using the spacers 409, silicide may be prevented from being formed on the bodies 403 during a subsequent silicidation process.

Figure 3E:
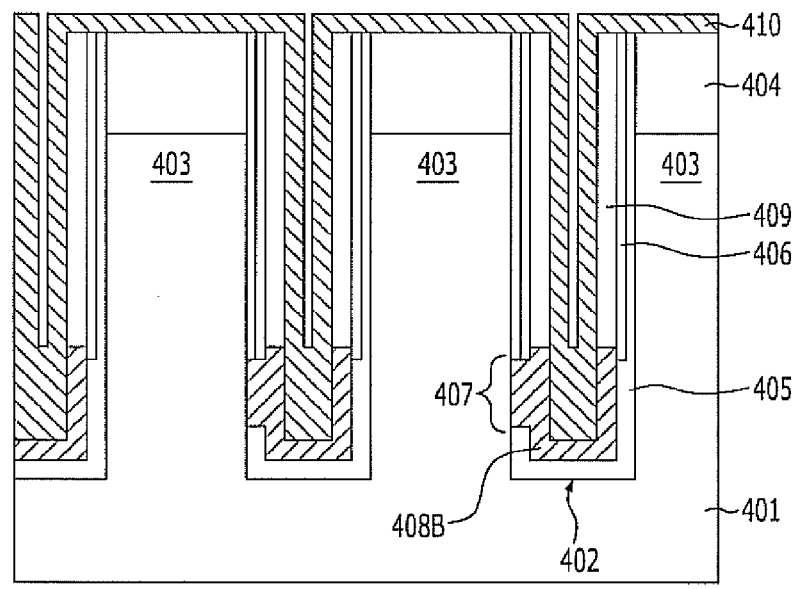

Referring to FIG. 3E, a metal layer 410 is formed. The metal layer 410 includes metals that may induce a silicidation reaction. For example, the metal layer 410 includes any one selected from the group consisting of cobalt (Co), titanium (Ti), tantalum (Ta), nickel (Ni), tungsten (W), platinum (Pt), and palladium (Pd). According to an example, a cobalt layer is used as the metal layer 410.

The metal layer 410 is formed through a CVD process or an ALD process. The process temperature, pressure and flow rate of the metal layer 410 are variable according to a precursor used, where the deposition thickness of the metal layer 209 ranges from approximately 10 Å to approximately 300 Å.

Figure 3F:
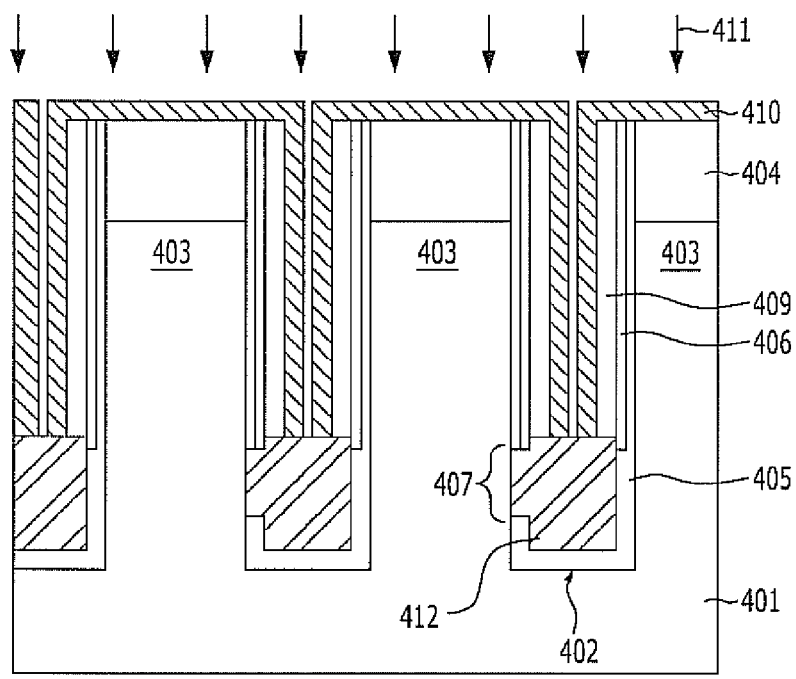

Referring to FIG. 3F, an annealing process 411 is performed. As a result, a metal silicide layer 412 is formed as the polysilicon layer pattern 408B reacts with the metal layer 410. The metal silicide layer 412 includes any one selected from the group consisting of cobalt silicide, titanium silicide, tantalum silicide, nickel silicide, tungsten silicide, platinum silicide, and palladium silicide. The annealing process 411 may be a rapid thermal annealing.

After the formation of the metal silicide layer 412, unreacted metal layer 410A remains.

Figure 3G:
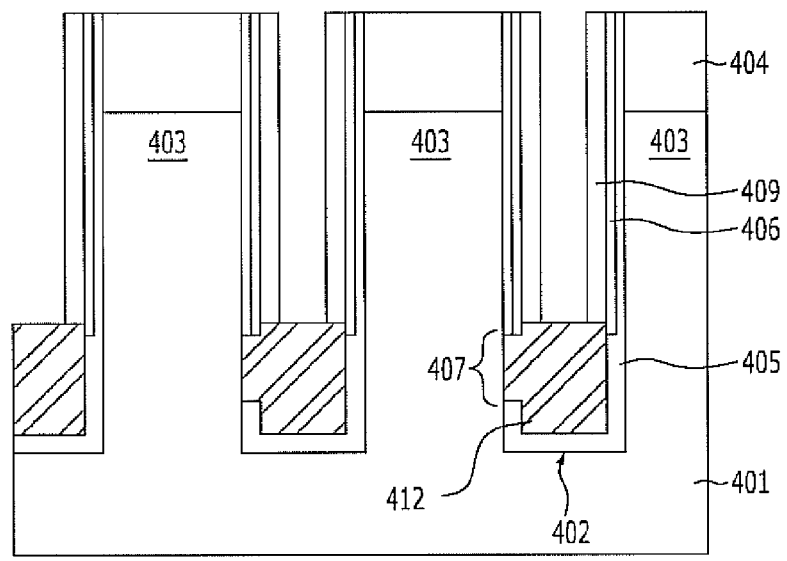

Referring to FIG. 3G, the unreacted metal layer 410A is removed. The unreacted metal layer 410A is removed through a wet-etch process.

According to an example, when the metal layer (410 in FIG. 3E) is a cobalt layer, the annealing process may be performed at least twice to form a cobalt silicide layer. Here, a primary annealing process and a secondary annealing process are performed. The primary annealing process is performed at a temperature ranging from approximately 400° C. to approximately 600° C., and the secondary annealing process is performed at a temperature ranging from approximately 600° C. to approximately 800° C. As a result of the primary annealing process, a cobalt silicide having a phase of $CoSi_x$ where x ranges from 0.1 to 1.5 is formed. As a result of the secondary annealing process, the cobalt silicide having a phase of $CoSi_x$ where x ranges from 0.1 to 1.5 is transformed into a cobalt silicide of a $CoSi_2$ phase. Among the cobalt silicides, the cobalt silicide of the $CoSi_2$ phase has the lowest resistivity. Unreacted cobalt layer (for example, 410 in FIG. 2F) is removed between the primary annealing process and the secondary annealing process by using a chemical mixture of sulfuric acid ($H_2SO_4$) and hydrogen peroxide ($H_2O_2$).

Figure 3H:
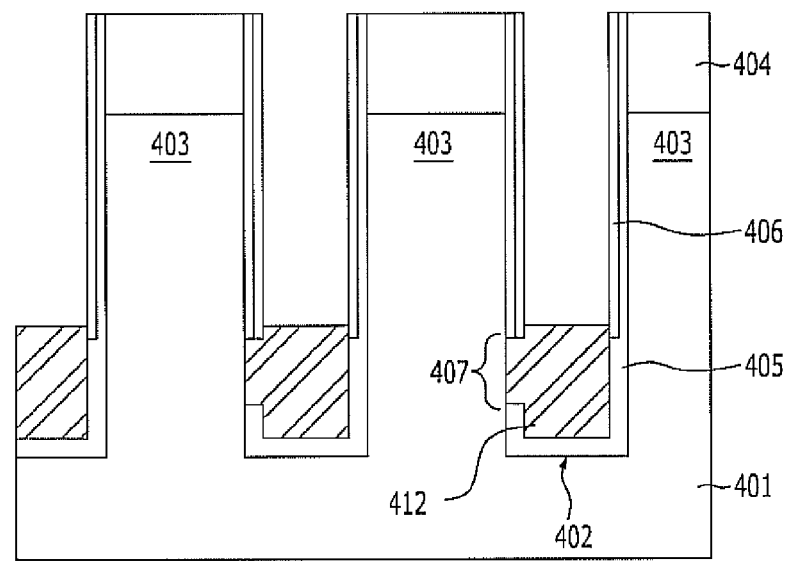

Referring to FIG. 3H, the spacers 409 are removed. Here, the spacers 409 are removed through a wet-etch process. When the spacers 409 are formed of TiN, they may be removed using the chemical mixture of sulfuric acid ($H_2SO_4$) and hydrogen peroxide ($H_2O_2$) between the primary annealing process and the secondary annealing process. According to another example, when the spacers 409 are formed of a dielectric material, the spacers 409 may not be removed.

The metal silicide layer 412 according to an example becomes a buried bit line BBL coupled with the body 403 through the opening 407. The resistance of buried bit lines BBL may be reduced by using the metal silicide layer 412 as the buried bit lines. Junction leakage is decreased because silicidation reaction is prevented in the bodies 403 by using the polysilicon layer pattern 408A as buffer.

By reducing the resistance of the buried bit lines, an operation speed of a semiconductor device may be increased.

According to the third exemplary embodiment of the present invention, the width and depth of the polysilicon layer pattern may be easily controlled.

FIGS. 4A to 4J are cross-sectional views illustrating a method for forming an opening in accordance with the above-described exemplary embodiments of the present invention.

Figure 4A:
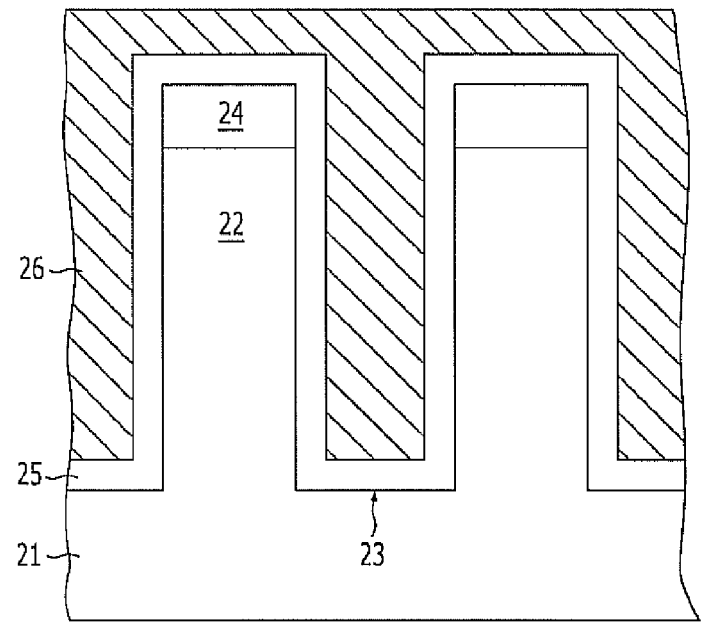
FIGS. 4A to 4J are cross-sectional views exemplarily illustrating a method for forming an opening in accordance with the exemplary embodiments of the present invention.

Referring to FIG. 4A, a hard mask layer 24 is formed over a substrate 21. The hard mask layer 24 may be a nitride layer. Alternatively, the hard mask layer 24 may be a stacked layer including an oxide layer and a nitride layer. For example, the hard mask layer 24 may be formed by sequentially stacking a hard mask (HM) nitride layer and a hard mask (HM) oxide layer. Also, the hard mask layer 24 may be formed by sequentially stacking a hard mask nitride layer, a hard mask oxide layer, a hard mask silicon oxynitride (SiON) layer, and a hard mask carbon layer. When the hard mask layer 24 includes a hard mask nitride layer, a pad oxide layer may be further formed between the substrate 21 and the hard mask layer 24. The hard mask layer 24 may be formed using a photoresist layer pattern (not shown).

Subsequently, a trench etch process is performed by using the hard mask layer 24 as an etch barrier. More specifically, bodies 22 are formed by using the hard mask layer 24 as an etch barrier and etching the substrate 21 for a desired depth. The bodies 22 are separated from each other by trenches 23 and each have two sidewalls and are used for forming transistors. The trench etch process may be an anisotropic etch process. When the substrate 21 is a silicon substrate, the anisotropic etch process may be a plasma dry etch process which uses chlorine ($Cl_2$) gas or hydrogen bromide (HBr) gas alone or a gas mixture thereof. Multiple bodies 22 are separated by the trenches 23 over the substrate 21. The bodies 22 may form line-type pillars which may also be referred to as line-type active pillars since they are active regions and form line-type pillars.

A first liner layer 25 is formed of an insulation layer. The first liner layer 25 includes an oxide layer such as a silicon oxide layer.

A sacrificial layer 26 gap-filling the trenches 23 between the bodies 22 are formed over the first liner layer 25. The sacrificial layer 26 according to an example includes undoped polysilicon or amorphous silicon.

Figure 4B:
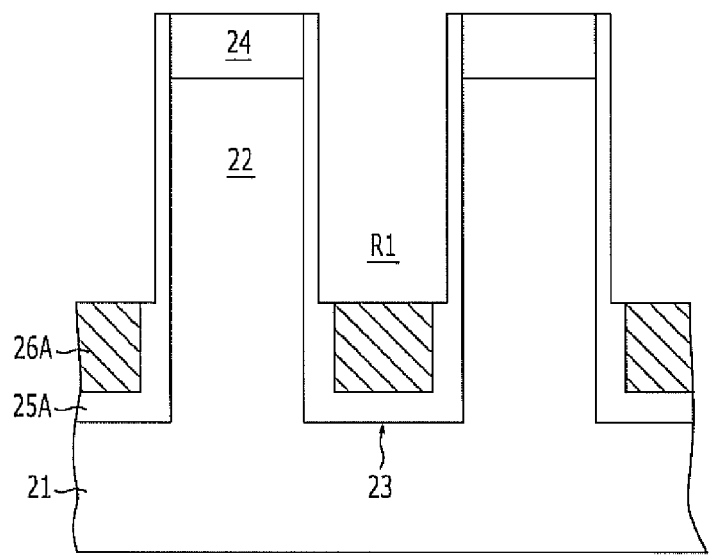

FIG. 4B, the sacrificial layer 26 is planarized until the surface of the hard mask layer 24 is exposed. The planarization of the sacrificial layer 26 includes a Chemical Mechanical Polishing (CMP) process. Subsequently, an etch-back process is performed to etch the sacrificial layer 26. As a result of the etch-back process, a sacrificial layer pattern 26A which provides a first recess R1 is formed. During the CMP process, the first liner layer 25 disposed over the hard mask layer 24 may be polished. As a result, a first liner layer pattern 25A covering the hard mask layer 24 and both sidewalls of each trench 23 is formed. The first liner layer pattern 25A also covers the bottom of each trench 23.

Subsequent to the etch-back process, the first liner layer pattern 25A is slimmed through a wet-etch process. Here, the first liner layer pattern 25A remains with a desired thickness on the sidewalls of each body 22 by controlling the time for the wet-etch process.

Figure 4C:
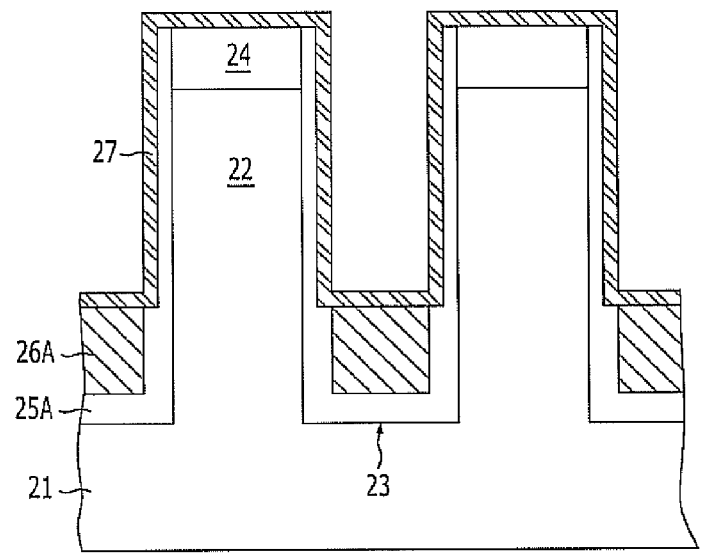

Referring to FIG. 4C, a second liner layer 27 is formed of an insulation layer over the substrate structure including the sacrificial layer pattern 26A. The second liner layer 27 includes a nitride layer, such as a silicon nitride layer. The second liner layer 27 is formed to have the same thickness as the reduced thickness of the slimmed first liner layer pattern 25A during the slimming process.

Figure 4D:
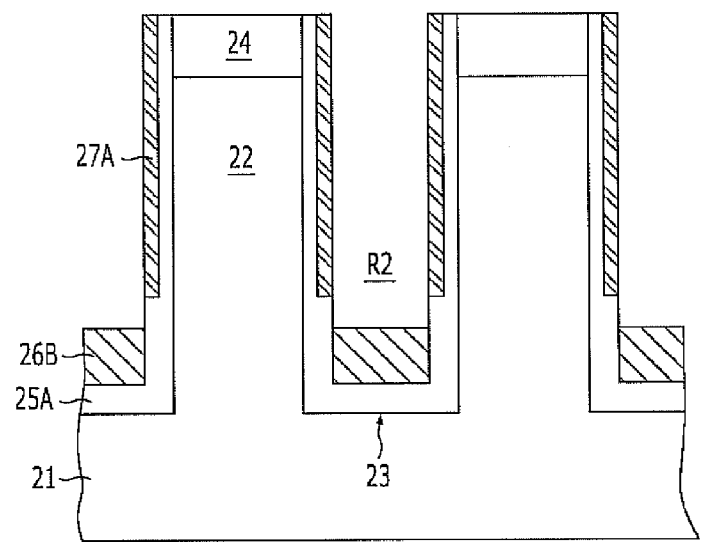

Referring to FIG. 4D, the second liner layer 27 is selectively etched. As a result, a second liner layer pattern 27A is formed in the slimmed area of the first liner layer pattern 25A. In forming the second liner layer pattern 27A, an etch-back process may be applied and the second liner layer pattern 27A may have the form of spacers.

Subsequently, the sacrificial layer pattern 26A is recessed for a desired depth by using the second liner layer pattern 27A as an etch barrier. As a result, a second recess R2 which exposes the surface of a portion of the first liner layer pattern 25A is formed. The sacrificial layer pattern 26A which forms the second recess R2 is denoted with reference numeral '26B'. When the sacrificial layer pattern 26B includes polysilicon, the sacrificial layer pattern 26A is recessed through an etch-back process.

Figure 4E:
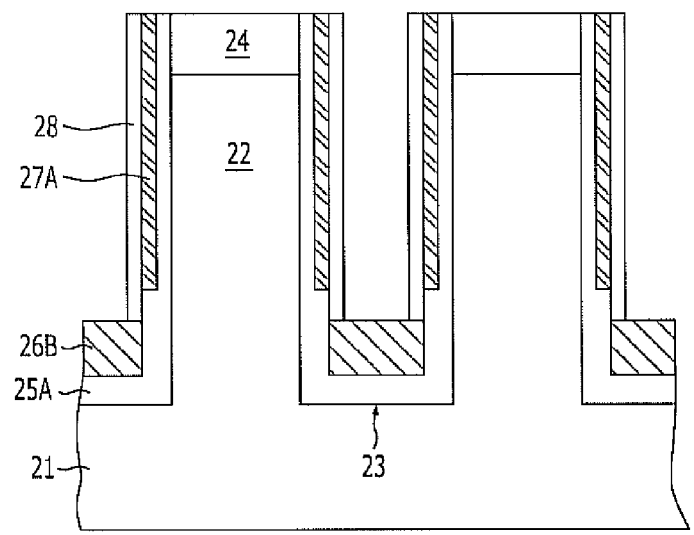

Referring to FIG. 4E, a metal nitride layer is uniformly formed over the substrate structure including the second recess R2. Subsequently, sacrificial spacers 28 are formed by performing a spacer etch process on the metal nitride layer. The sacrificial spacers 28 are formed on both sidewalls of each body 22 and may be a titanium nitride (TiN) layer.

Figure 4F:
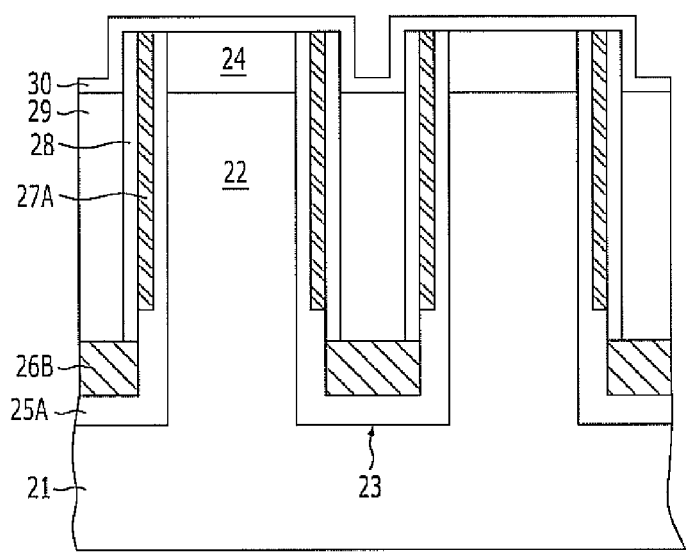

Referring to FIG. 4F, a gap-fill layer for gap-filling the second recess R2 where the sacrificial spacers 28 are formed.

The gap-fill layer may be an oxide layer. According to an example, the gap-fill layer may be a Spin-On-Dielectric (SOD) layer.

Subsequently, the gap-fill layer is planarized and then an etch-back process is performed so that a recessed gap-fill layer 29 as shown in FIG. 4F is formed.

A third liner layer 30 is formed over the substrate structure including the recessed gap-fill layer 29. The third liner layer 30 includes undoped polysilicon.

Figure 4G:
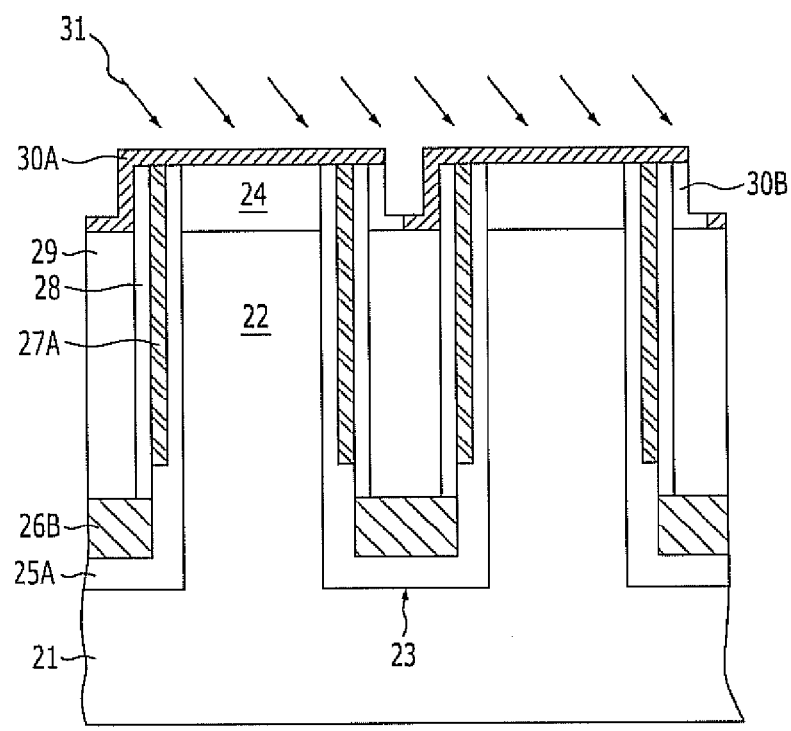

Referring to FIG. 4G, a tilt ion implantation process 31 is performed.

The tilt ion implantation process 31 is a process of ion-implanting a dopant at a predetermined angle. The dopant is implanted to a portion of the third liner layer 30 (FIG. 4F).

The tilt ion implantation process 31 is performed at a desired angle. The angle ranges from approximately 5° to approximately 50°. A portion of ion beam is shadowed by the hard mask layer 24. Therefore, a portion of the third liner layer 30 is doped while another portion of the third liner layer 30 remains undoped. According to an example, an ion-implanted dopant is a P-type dopant, e.g., boron. To ion-implant boron, $BF_2$ is used as a dopant source. As a result, a portion (30B) of the third liner layer 30 on the right side of the hard mask layer 24 remains undoped.

As a result of the tilt ion implantation process 31 of the dopant, the third liner layer 30 (FIG. 4F) becomes a doped third liner layer 30A including a portion on the left side of the hard mask layer 24 and a portion formed on the upper surface of the hard mask layer 24. The portion 30B of the third liner layer is not doped and becomes an undoped third liner layer 30B.

Figure 4H:
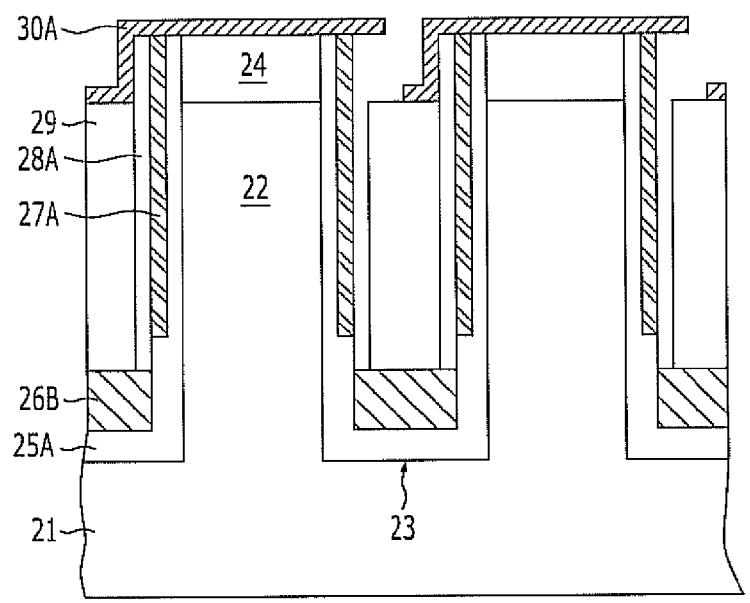

Referring to FIG. 4H, the undoped third liner layer 30B is removed. Here, different portions of the polysilicon used as the third liner layer is etched at different etch rate depending on the dopant presence. More specifically, the undoped polysilicon into which the dopant is not implanted has a fast wet-etch rate. Therefore, the undoped polysilicon is selectively removed by using a chemical having a high selectivity that may etch the undoped polysilicon, where a wet etch process or a wet cleaning process may be used for the etch.

After the undoped third liner layer 30B is removed, only the doped third liner layer 30A remains.

Using the remaining doped third liner layer 30A, one of the sacrificial spacers 28 in each trench 23 is removed. As a result, a gap (not denoted with a reference numeral) is formed between the recessed gap-fill layer 29 and the second liner layer pattern 27A. The sacrificial spacer 28 is removed through a wet etch process. As a result, only one sacrificial spacer remains in each trench 23. The remaining sacrificial spacer is denoted with a reference numeral '28A'.

Figure 4I:
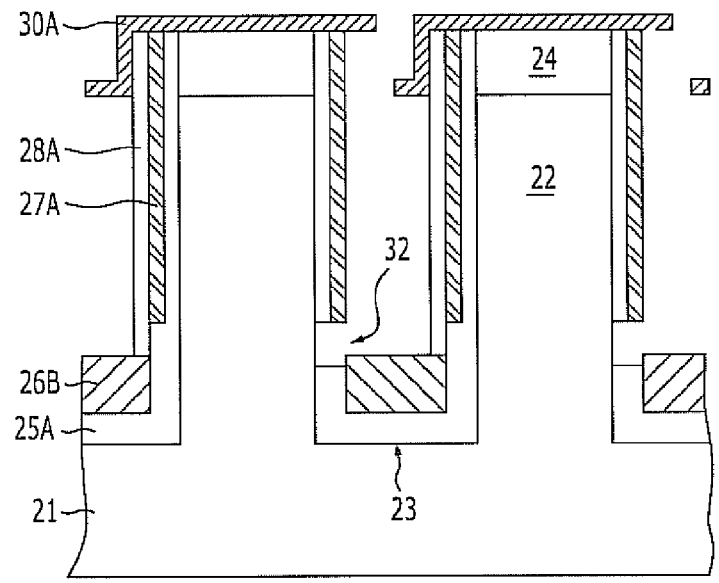

Referring to FIG. 4I, a cleaning process is performed to expose a portion of one sidewall.

The cleaning process includes a wet cleaning process. The wet cleaning process is performed using, for example, hydrofluoride (HF) or a buffered oxide etchant (BOE). With the wet cleaning process, the first liner layer pattern 25A may be selectively removed without damaging the sacrificial layer pattern 26B, the remaining sacrificial spacer 28A, and the second liner layer pattern 27A.

Here, the hard mask layer 24, the first liner layer pattern 25A, the second liner layer pattern 27A, the sacrificial layer pattern 26B, and the remaining sacrificial spacer 28A are collectively referred to as an 'insulation layer' and collectively provide an opening 32 which exposes a portion of one sidewall of each body 22.

The opening 32 corresponds to the openings in the above-described exemplary embodiments of the present invention.

Figure 4J:
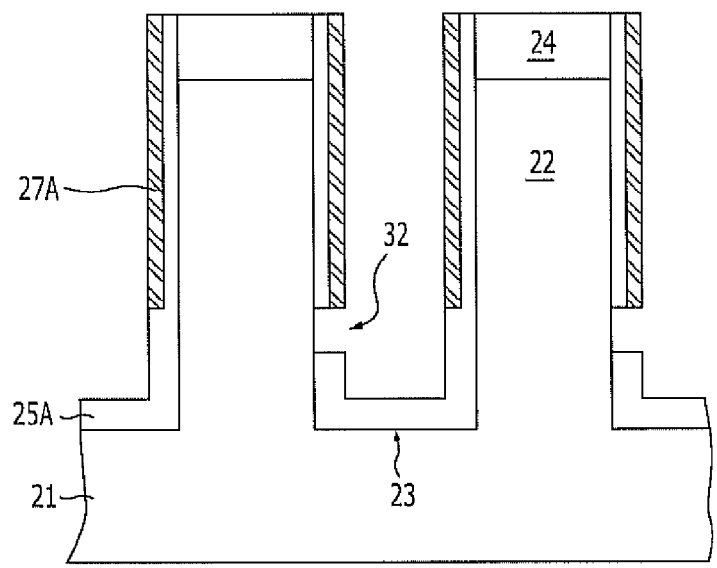

Referring to FIG. 4J, the doped third liner layer 30A is removed. Here, the doped third liner layer 30A and the sacrificial layer pattern 26B all include polysilicon and are removed at the same time.

Subsequent to the removal of the doped third liner layer 30A and the sacrificial layer pattern 26B, the remaining sacrificial spacer 28A is removed.

According to an exemplary embodiment of the present invention, the resistance of buried bit lines may be decreased by forming buried bit lines of a metal silicide layer, and the junction leakage originating from a direct silicidation reaction of active regions may be prevented by using polysilicon as buffer.

Since the junction leakage and bit line resistance are decreased, an operation speed of a semiconductor device may be increased and an improved reliability may be obtained.

Figure 5:
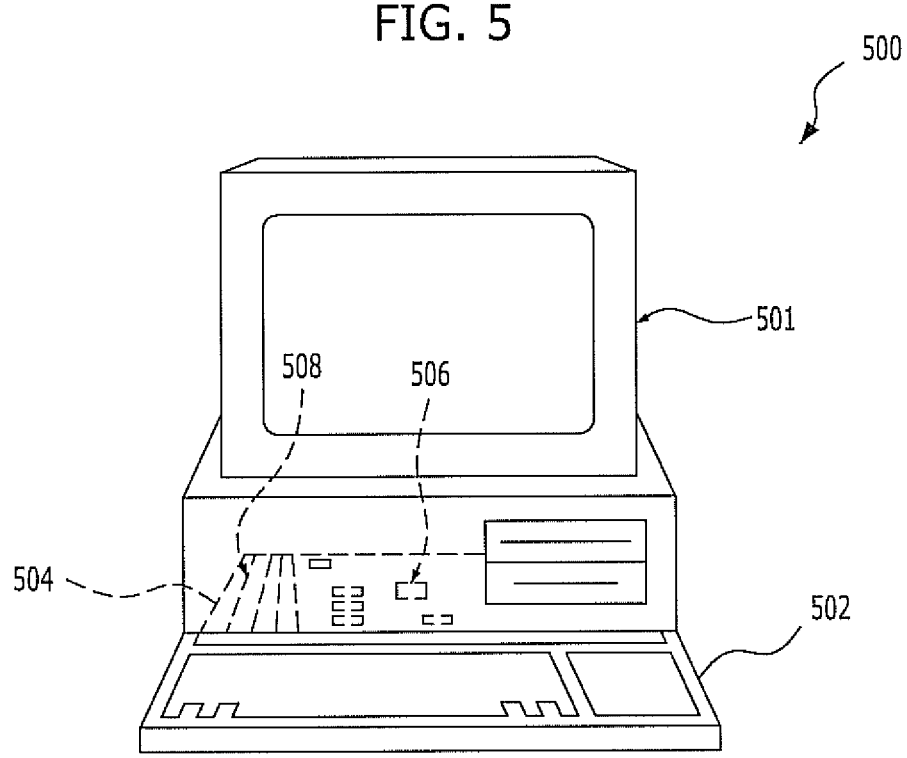
FIG. 5 illustrates an embodiment of a computer system according to an aspect of the present invention.

FIG. 5 illustrates an embodiment of a computer system according to an aspect of the present invention.

Referring to FIG. 5, a computer system 500 includes an output device (e.g., monitor) 501, an input device (e.g., keyboard) 502, and a motherboard 504.

The motherboard 504 may carry a data processing unit (e.g., microprocessor) 506 and at least one memory device 508. The memory device 508 may comprise various aspects of the invention described above. The memory device 508 may comprise an array of memory cells. Various components of the computer system 500 including the processor 506 may comprise at least one memory construction described in the present invention.

The processor device 506 may correspond to a processor module, and associated memory utilized with the module may comprise teachings of the present invention.

The memory device 508 may correspond to a memory module. For example, single in-line memory modules (SIMMs) and dual in-line memory modules (DIMMs) may be used in the implementations which utilize the teachings of the present invention.

While the present invention has been described with respect to the specific exemplary embodiments, it will be apparent to those skilled in the art that various changes and modifications may be made without departing from the spirit and scope of the invention as defined in the following claims.

What is claimed is:

1. A method for fabricating a semiconductor device, comprising:
   etching a substrate to form trenches that separate active regions;
   forming an insulation layer having an opening to open a portion of a sidewall of each active region;
   forming a silicon layer pattern to gap-fill a portion of each trench and cover the opening in the insulation layer;
   wherein the forming of the silicon layer pattern comprises:
      forming a silicon layer having a seam within the silicon layer,
      wherein the silicon layer gap-fills the trenches; and
      etching the silicon layer to etch an upper portion of the seam, wherein the etched silicon layer covers the opening;
   forming a metal layer over the silicon layer pattern; and
   forming a metal silicide layer as buried bit lines, wherein the metal silicide layer is formed when the metal layer reacts with the silicon layer pattern.

2. The method of claim 1, wherein the silicon layer is deposited at a temperature ranging from 600° C. to 900° C.

3. The method of claim 1, wherein the forming of the silicon layer pattern comprises:

depositing a silicon layer through an atomic layer deposition (ALD) process or a chemical vapor deposition (CVD) process; and
etching the silicon layer.

4. The method of claim 1, wherein the silicon layer pattern includes a polysilicon layer.

5. The method of claim 1, wherein the metal layer includes one selected from the group consisting of cobalt (Co), titanium (Ti), tantalum (Ta), nickel (Ni), tungsten (W), platinum (Pt), and palladium (Pd).

6. The method of claim 1, wherein the forming of the metal silicide layer is performed using a rapid thermal annealing (RTA) method.

7. The method of claim 1, further comprising removing a remained portion of the metal layer, which is not reacted with the silicon layer pattern, after the forming of the metal silicide layer.

8. A method for fabricating a semiconductor device, comprising:
   etching a substrate to form trenches that separate active regions;
   forming an insulation layer having an opening to open a portion of a sidewall of each active region;
   forming a silicon layer pattern to gap-fill a portion of each trench and cover the opening in the insulation layer;
   wherein the forming of the silicon layer pattern comprises:
      forming a silicon layer over the insulation layer to gap-fill the trenches;
      performing a primary etch process on the silicon layer;
      forming spacers on sidewalls of the insulation layer after the primary etch process; and
      performing a secondary etch process on the silicon layer by using the spacers as an etch barrier;
   forming a metal layer over the silicon layer pattern; and
   forming a metal silicide layer as buried bit lines, wherein the metal silicide layer is formed when the metal layer reacts with the silicon layer pattern.

9. The method of claim 8, wherein the silicon layer pattern has a U-shaped cavity after the secondary etch process.

10. A method for fabricating a semiconductor device, comprising:
   etching a substrate to form trenches that separate active regions;
   forming an insulation layer having an opening to open a portion of a sidewall of each active region;
   forming a silicon layer over the insulation layer to gap-fill a portion of each trench and cover the opening in the insulation layer;
   forming spacers on portions of sidewalls of the insulation layer;
   etching the silicon layer by using the spacers as an etch barrier;
   forming a metal layer over the etched silicon layer; and
   forming a metal silicide layer as buried bit lines, wherein the metal silicide layer is formed when the metal layer reacts with the silicon layer.

11. The method of claim 10, wherein the forming of the spacers comprises:
   forming a spacer layer to be used as the spacers over the portions of the sidewalls of the insulation layer; and
   performing an etch-back process on the spacer layer.

12. The method of claim 10, wherein the spacers comprise one selected from the group consisting of an insulation layer, a metal layer, and a metal nitride layer.

13. The method of claim 10, wherein the spacers comprise one selected from the group consisting of a silicon layer, a silicon oxide layer, a silicon nitride layer, TiN, TiAlN, TiW, $TiO_2$, $WSi_2$, WN, TaN, TaW and $Ta_2O_5$.

14. The method of claim 10, wherein in the forming of the silicon layer, the silicon layer comprises a polysilicon layer.

15. The method of claim 10, wherein the silicon layer is deposited through an atomic layer deposition (ALD) process or a chemical vapor deposition (CVD) process.

16. The method of claim 10, wherein the metal layer comprises one selected from the group consisting of cobalt (Co), titanium (Ti), tantalum (Ta), nickel (Ni), tungsten (W), platinum (Pt), and palladium (Pd).

17. The method of claim 10, wherein the forming of the metal silicide layer comprises:
   performing a primary annealing process to react the metal layer with the silicon layer;
   removing a remained portion of the metal layer, which is not reacted with the silicon layer; and
   performing a secondary annealing process.

18. The method of claim 10, wherein the metal silicide layer comprises a cobalt silicide layer.

19. The method of claim 10, wherein the forming of the metal silicide layer is performed using a rapid thermal annealing (RTA) method.

20. The method of claim 10, wherein the forming of the metal silicide layer comprises:
   performing an annealing process to react the metal layer with the silicon layer; and
   removing the metal layer.

21. The method of claim 10, further comprising:
   removing the spacers after the forming of the metal silicide layer.

22. The method of claim 10, wherein after the etching of the silicon layer by using the spacers as the etch barrier,
   the silicon layer remains on the bottom and sidewalls of each trench and fills the opening.

23. The method of claim 10, wherein after the etching of the silicon layer by using the spacers as the etch barrier,
   the silicon layer remains on sidewalls of each trench and fills the opening.

24. The method of claim 10, wherein after the etching of the silicon layer by using the spacers as the etch barrier, the etched silicon layer has a cavity.

* * * * *